(12) United States Patent
Teng et al.

(10) Patent No.: US 7,774,688 B1
(45) Date of Patent: Aug. 10, 2010

(54) HARDWARE EFFICIENT DECODING SYSTEM FOR BOSE, RAY-CHAUDHURI, HOCQUENGHEM (BCH) PRODUCT CODES

(75) Inventors: Heng Teng, Sunnyvale, CA (US); Zining Wu, Los Altos, CA (US); Xueshi Yang, Sunnyvale, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 391 days.

(21) Appl. No.: 11/974,141

(22) Filed: Oct. 11, 2007

Related U.S. Application Data

(60) Provisional application No. 60/829,059, filed on Oct. 11, 2006.

(51) Int. Cl.
*H03M 13/00* (2006.01)
(52) U.S. Cl. .................. 714/782; 714/784; 714/785
(58) Field of Classification Search ............. 714/782, 714/784, 785
See application file for complete search history.

(56) References Cited

U.S. PATENT DOCUMENTS

| | | | | |
|---|---|---|---|---|
| 4,868,828 A * | 9/1989 | Shao et al. | ............ | 714/704 |
| 5,323,402 A * | 6/1994 | Vaccaro et al. | ............ | 714/782 |
| 6,263,470 B1 * | 7/2001 | Hung et al. | ............ | 714/784 |
| 6,453,441 B1 * | 9/2002 | Daoudi et al. | ............ | 714/784 |
| 6,487,691 B1 * | 11/2002 | Katayama et al. | ............ | 714/784 |
| 6,507,926 B1 * | 1/2003 | Wright | ............ | 714/776 |
| 6,539,515 B1 * | 3/2003 | Gong | ............ | 714/784 |
| 6,594,794 B1 * | 7/2003 | De Marzi et al. | ............ | 714/784 |
| 6,832,042 B1 * | 12/2004 | Shieh | ............ | 386/125 |
| 7,096,403 B2 * | 8/2006 | Seki | ............ | 714/755 |
| 7,586,808 B2 * | 9/2009 | Kwon et al. | ............ | 365/230.03 |
| 7,613,988 B1 * | 11/2009 | Wu et al. | ............ | 714/784 |

* cited by examiner

*Primary Examiner*—Esaw T Abraham

(57) ABSTRACT

A decoder that decodes Bose, Ray-Chaudhuri, Hocquenghem (BCH) codewords includes an inner decoding module that decodes inner codes of two dimensional BCH product codewords and that includes an error decoding module that computes error values, an outer decoding module that decodes outer codes of the two dimensional BCH product codewords, and an error correction module that employs the error decoding module to iteratively correct errors in the two-dimensional BCH product codewords.

21 Claims, 6 Drawing Sheets

HARDWARE EFFICIENT DECODING SYSTEM FOR BOSE, RAY-CHAUDHURI, HOCQUENGHEM (BCH) PRODUCT CODES

CROSS-REFERENCE TO RELATED APPLICATIONS

This application claims the benefit of U.S. Provisional Application No. 60/829,059, filed on Oct. 11, 2006. The disclosure of the above application is incorporated herein by reference in its entirety.

FIELD

The present disclosure relates to decoding product codes in a communication system.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a data diagram shows a two-dimensional Bose, Ray-Chaudhuri, Hocquenghem (BCH) product codeword. The BCH product codeword includes data 10 that is encoded with a concatenated code. The concatenated code includes an inner code and an outer code, which are both one-dimensional BCH codes. The parity of the inner BCH code 12 and the parity of the outer BCH code 14 are arranged as in FIG. 1. Every row forms a codeword of the inner code and every column forms a codeword of the outer code. The inner and outer codes facilitate error detection and correction at a receiver as described below.

Referring now to FIG. 2, a functional block diagram shows a communication system 20 in pertinent part. An outer code encoding module 22 encodes data 10 with the outer code. The outer code is a BCH code. In some applications the BCH code is a non-binary code such as Reed-Solomon (RS). An inner code encoding module 24 receives the encoded data from outer code encoding module 22 and completes encoding the data with the inner BCH code. A communication channel 26 communicates or stores the BCH codeword from inner code encoding module 24. Examples of channel 26 include magnetic media, such as a disk platter in a hard disk drive, a flash drive, a wireless communication channel, a fiber optic communication channel, a wired communication channel, computer readable memory, and the like.

The encoding process is reversed to receive or decode the BCH codeword from channel 26. A receiver or read channel includes an inner code decoding module 28. Inner code decoding module 28 receives the BCH codeword from channel 26 and decodes the inner code. An outer code decoding module 30 receives the partially decoded BCH codeword from inner code decoding module 28 and decodes the outer code. The decoded BCH codeword can be taken at an output of outer code decoding module 30.

SUMMARY

A decoder that decodes Bose, Ray-Chaudhuri, Hocquenghem (BCH) codewords includes an inner decoding module that decodes inner codes of two dimensional BCH product codewords and that includes an error decoding module that computes error values, an outer decoding module that decodes outer codes of the two dimensional BCH product codewords, and an error correction module that employs the error decoding module to iteratively correct errors in the two-dimensional BCH product codewords.

In other features the error decoding module includes an error-locator polynomial computation module that calculates error locator polynomials based on the BCH codewords. The error decoding module further comprises a Chien search module that calculates roots of the error locator polynomials. The error-locator polynomial computation module employs one of a Berlekamp-Massey, a Euclidian, and a Berlekamp-Welch decoding algorithm to compute the error locator polynomials. The inner decoding module marks error rows of the BCH codewords as erasures.

In other features the outer decoding module further includes an outer BCH syndrome computation module that performs a syndrome computation on the outer codes, and an error evaluation polynomial module that calculates error evaluation polynomials based on the outer BCH codewords. The outer decoding module further comprises an error value computation module that computes error values based on the outer BCH codewords. The error decoding module comprises a central processing unit and memory that stores computer readable instructions. The computer readable instructions implement an iterative correction algorithm.

A method of decoding Bose, Ray-Chaudhuri, Hocquenghem (BCH) codewords includes decoding inner codes of two dimensional BCH product codewords, including computing error values, decoding outer codes of the two dimensional BCH product codewords, and iteratively employing the step of computing error values to correct errors in the two-dimensional BCH product codewords.

In other features the step of computing error values includes calculating error locator polynomials based on the BCH codewords. The step of computing error values further comprises calculating roots of the error locator polynomials. Calculating error locator polynomials employs one of a Berlekamp-Massey, a Euclidian, and a Berlekamp-Welch decoding algorithm. Decoding inner codes includes marking error rows of the BCH codewords as erasures.

In other features decoding outer codes further includes performing a syndrome computation on the outer codes, and calculating error evaluation polynomials based on the outer BCH codewords. Decoding outer codes further comprises computing error values based on the outer BCH codewords. The method includes providing a central processing unit and memory that stores computer readable instructions. The computer readable instructions implement the step of iteratively employing the step of computing error values.

A decoder that decodes Bose, Ray-Chaudhuri, Hocquenghem (BCH) codewords includes inner decoding means for decoding inner codes of two dimensional BCH product codewords and that includes error decoding means for computing error values, outer decoding means decoding outer codes of the two dimensional BCH product codewords, and error correction means for employing the error decoding means to iteratively correct errors in the two-dimensional BCH product codewords.

In other features the error decoding module includes error-locator polynomial computation means for calculating error locator polynomials based on the BCH codewords. The error decoding means further comprises a Chien search means for calculating roots of the error locator polynomials. The error-locator polynomial computation means employs one of a Berlekamp-Massey, a Euclidian, and a Berlekamp-Welch decoding algorithm to compute the error locator polynomials. The inner decoding means marks error rows of the BCH codewords as erasures.

In other features the outer decoding means further includes outer BCH syndrome computation means for performing a syndrome computation on the outer codes, and error evaluation polynomial means for calculating error evaluation polynomials based on the outer BCH codewords. The outer decoding means further comprises error value computation means for computing error values based on the outer BCH codewords. The error decoding means comprises a central processing unit and memory that stores computer readable instructions, wherein the computer readable instructions implement an iterative correction algorithm.

A method of decoding Bose, Ray-Chaudhuri, Hocquenghem (BCH) codewords is implemented by a computer program executed by one or more processors. The computer program can reside on a computer readable medium such as but not limited to memory, non-volatile data storage and/or other suitable tangible storage mediums. The computer program includes decoding inner codes of two dimensional BCH product codewords, including computing error values, decoding outer codes of the two dimensional BCH product codewords, and iteratively employing the step of computing error values to correct errors in the two-dimensional BCH product codewords.

In other features the step of computing error values includes calculating error locator polynomials based on the BCH codewords. The step of computing error values further comprises calculating roots of the error locator polynomials. Calculating error locator polynomials employs one of a Berlekamp-Massey, a Euclidian, and a Berlekamp-Welch decoding algorithm. Decoding inner codes includes marking error rows of the BCH codewords as erasures.

In other features decoding outer codes further includes performing a syndrome computation on the outer codes, and calculating error evaluation polynomials based on the outer BCH codewords. Decoding outer codes further comprises computing error values based on the outer BCH codewords.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
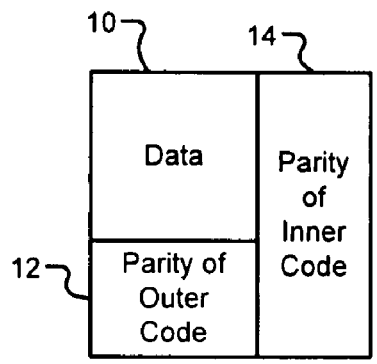
FIG. 1 is a data diagram of a concatenated code of the prior art.
Figure 2:
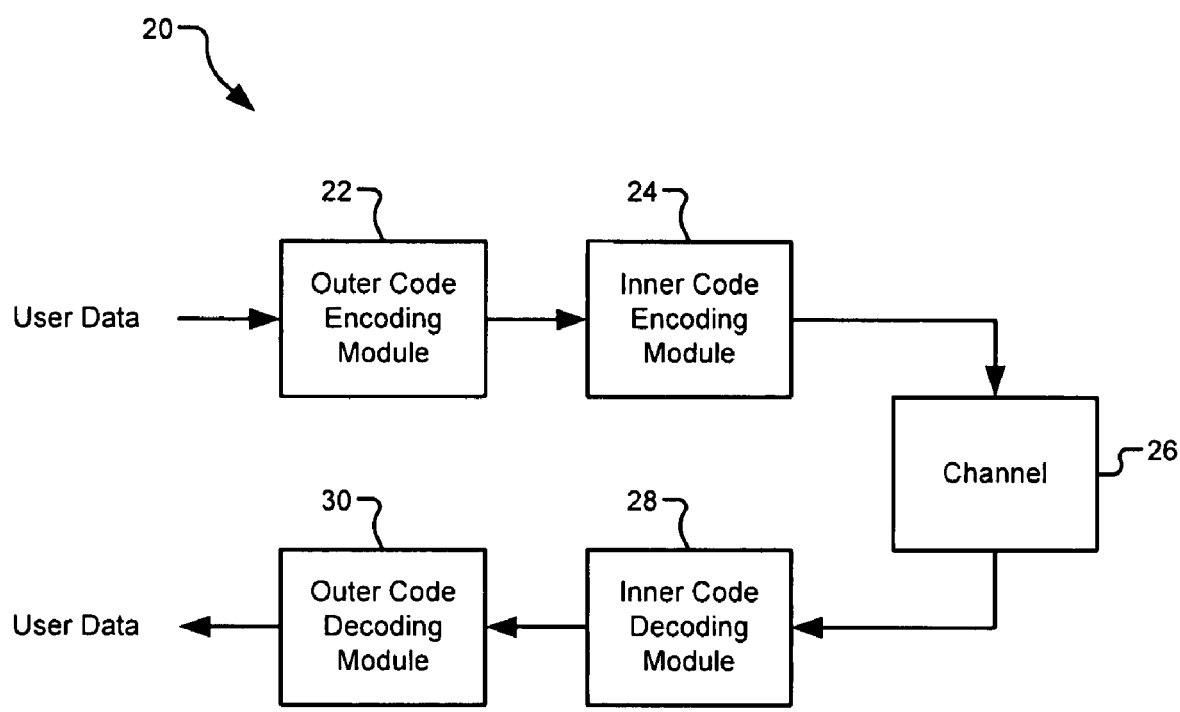
FIG. 2 is a functional block diagram of a communication system of the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

In some communication systems it is desirable to reduce the amount of power that is consumed by the inner and outer code decoding modules. Reducing the power can help extend battery life in portable devices, reduce heat dissipation from integrated circuits, and the like. Described herein is a method and apparatus that decodes concatenated and product codes. A decoder employs a shared module that performs at least a portion of the inner code decoding and at least a portion of the outer code decoding. The shared module can reduce a number of circuit components, such as transistors, in a decoder design and thereby reduce power consumption when compared to the prior art.

The following description of a decoder assumes that Bose, Ray-Chaudhuri, Hocquenghem (BCH) codewords are encoded with a two-dimensional product code. The description also assumes that inner and outer codes are BCH codes. The BCH codes can be binary BCH codes or non-binary BCH codes such as Reed-Solomon (RS) codes). In some embodiments user data is encoded with a concatenated code with interleaving, where the row code is the inner code and the column code is the outer code. The inner and outer codes are constructed from the same finite field GF ($2^m$), where m is chosen large enough to accommodate the encoding in column and row dimension.

An operating theory of the decoder will now be provided. A decoding algorithm for BCH and/or RS codes can include the following steps: performing a syndrome computation on a received BCH codeword; applying results of the syndrome computation to a Berlekamp-Massey decoding algorithm (BMA) that computes an error-locator polynomial; applying a Chien search to find roots of the error locator polynomial; and computing error values using Forney's algorithm. It should be appreciated that a Euclidian decoding algorithm and a Berlekamp-Welch decoding algorithm may be employed instead of the BMA decoding algorithm. Roots of the error locator polynomial yield locations of errors in the user data. In some implementations, an error value computation method, such as a Forney algorithm, can then be used to compute the error value at each error location. When the BCH code is a binary code, then the error value computation method may be omitted since the erroneous bits can simply be inverted.

The preceding decoding process may be abbreviated when the syndrome computation returns all zeros. All zeros indicates that the received BCH codeword is a valid BCH codeword, and therefore decoding is not necessary. Therefore, steps after the syndrome calculation maybe omitted.

The operating theory of the decoder also takes advantage of differences between erasure decoding and error decoding. With error decoding, the decoder does not have a priori information regarding the error locations. With erasure decoding, the decoder has a priori information regarding the locations of errors. The decoder may then employ the a priori information to facilitate decoding and conserve poser. Note that the decoding steps in the immediately preceding paragraphs describe the process for error decoding.

For product codes, if the inner or row decoding fails, the row can, be marked with erasures. The outer or column code and a priori information, i.e. the erasure markings, can then be employed to efficiently decode outer BCH codeword. Erasures indicate that the symbols in a given row are not reliable; however the symbols are not actually erased. Because of the erasure markings the BMA and the Chien search are not required. Erasure decoding can therefore also be implemented with fewer transistors and consume less power than error decoding.

Error decoding in one of the two dimensions generally reduces the number of errors. Therefore fewer errors are left for the remaining dimension. The row-column decoding process can be carried out in an iterative way until all decodings succeed or a predetermined maximum number of iterations are reached. However, if miscorrection occurs during row code decoding, then erasure decoding of the column code will not be able to successfully recover user data since some of the erroneous rows are not marked as erasure. Therefore erasure decoding of outer code is not suitable for iterative decoding.

Figure 3:
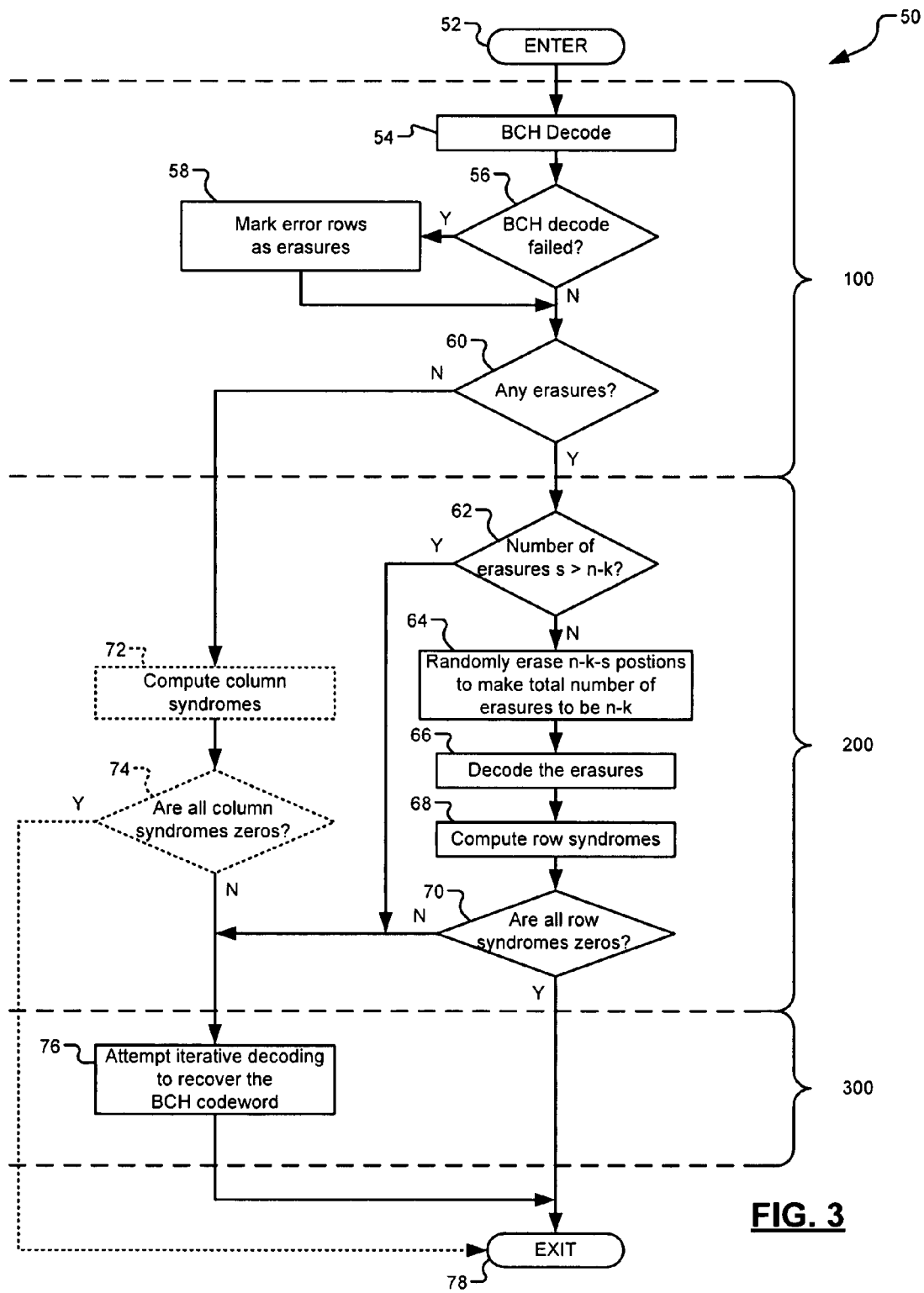
FIG. 3 is a flowchart showing a three-stage decoding process.
Figure 4:
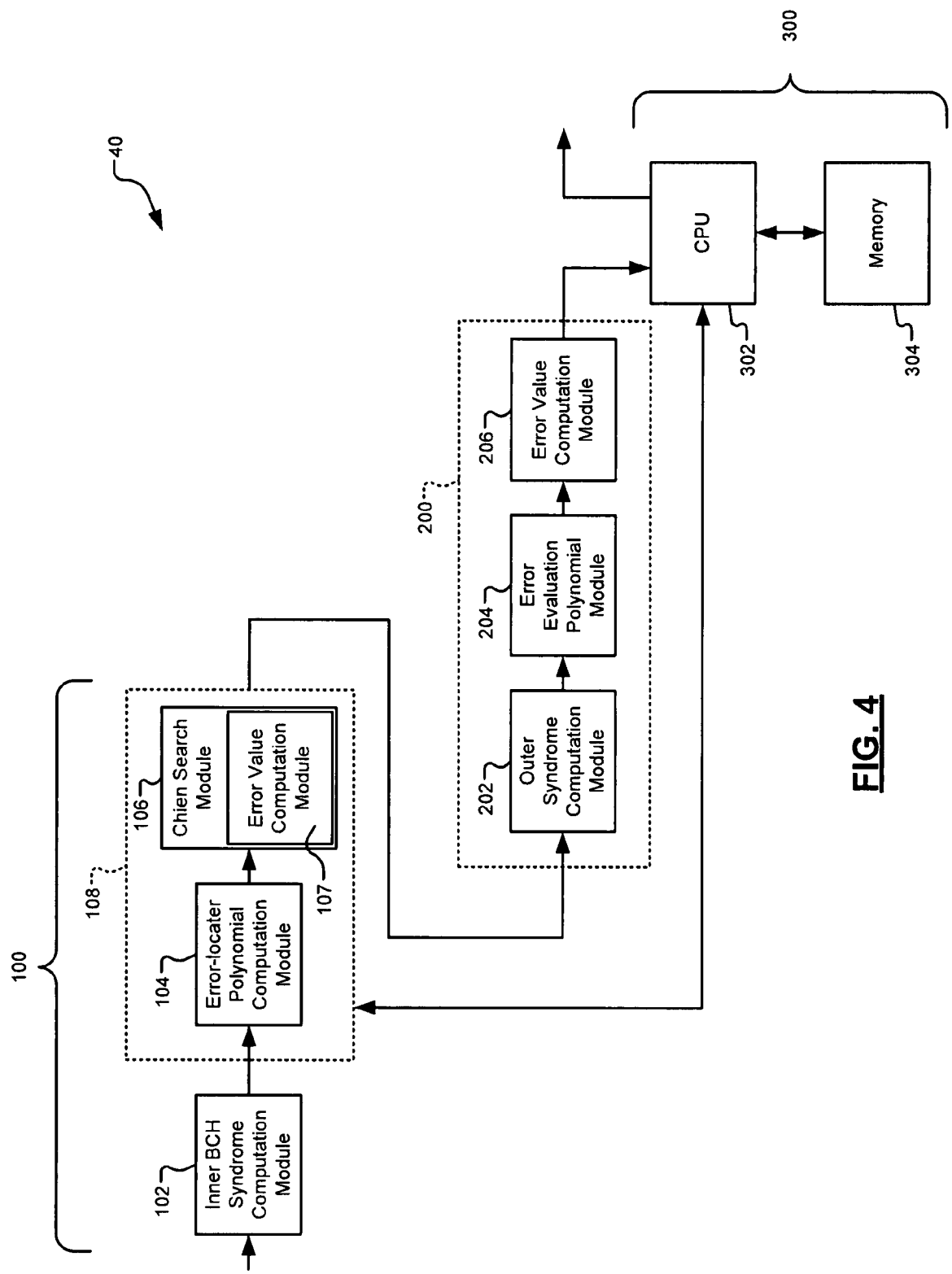
FIG. 4 is functional block diagram of a three-stage decoder.

Since erasure decoding of RS codes can consume less power than error decoding, and iterative decoding can improve decoding accuracy, a decoder can be employed that has three stages or modules. First and third stages employ properties of the BCH codes to share components and thereby reduce power dissipation. A second stage performs erasure decoding. FIG. 3 depicts a three-stage decoding method 50. FIG. 4 depicts a functional block diagram of a three-stage decoder 40 which implements method 50.

Referring now to FIG. 3, a flowchart shows three-stage decoding method 50. On the right side of the flowchart are brackets that indicate which functions and/or steps are performed by each module of the corresponding three-stage decoder 40 that is shown in FIG. 4. The three modules include a row or inner decoding module 100, a column or outer decoding module 200, and an error correction module 300. Inner decoding module 100 implements blocks 54 through 58 and 66. Outer decoding module 200 implements blocks 60 through 64. Error correction module 300 implements block 68. Method 50 executes when three-stage decoder 40 receives a BCH codeword that was received from the channel.

Control enters at block 52 and immediately proceeds to block 54. In block 54, control decodes the rows or inner codes of the product codeword. Control then proceeds to decision block 56 and determines whether the decode failed for any of the rows. If so, then control branches to block 58 and marks the failed rows as including erasures.

Control proceeds to decision block 60 from decision block 56 and block 58. In decision block 60 control determines if there are any marked erasures. If not, then control may exit via block 78. Block 72 and decision block 74 are optional. They may be employed to improve robustness of method 50. When they are used, control branches to block 72 upon a negative determination in decision block 60. In block 72 control computes the syndromes of the outer/column BCH code. control then branches to decision block 74 and determines whether all column syndromes are zeros. If so, then control assumes that the decoding is successful and exits via exit block 78 without doing further checking and/or corrections. Otherwise, control proceeds to block 76 and the performs iterative decoding. Again, the computation and checking of column syndromes in blocks 72 and 74 are optional. These two blocks can be omitted if it is determined that the misdirection probability of inner/row code is less than a predetermined probability.

If the determination in decision block 60 is affirmative, then control branches to decision block 62. In decision block 62, control determines whether the number of erasures, denoted by s, is greater than n-k, where n is the number of symbols per BCH codeword and k is the number of symbols per message. Control branches to block 76 when the result of decision block 62 is affirmative. In block 76, control executes the iterative error decoding scheme in an attempt to recover the product codeword. Block 76 is implemented such that it employs hardware that also implements block 54, as is described further below.

If the determination in decision block 62 is negative, then control branches to block 64. In block 64 control randomly selects n-k-s positions and marks them as erasures. This makes the total number of erasures equal to n-k before performing the erasure decoding in block 66. In block 66, control performs erasure decoding on the outer or column BCH codeword. Control branches from block 66 to block 68 and computes the row syndromes. Control then branches to decision block 70 and checks if each syndrome is equal to zero to determine whether each row is a valid inner/row BCH codeword. If not, then a miscorrection happens to the column decoding and control branches to block 76 and employs the iterative decoding process to attempt correcting the errors. On the other hand, if control detected that every row is a valid inner/row BCH codeword in decision block 70 then control exits via exit block 78.

Referring now to FIG. 4, a functional block diagram is shown of three-stage decoder 40. Inner decoding module 100 receives the product codeword that was transmitted over the channel, which may include noise. An inner BCH syndrome computation module 102 performs a syndrome computation on the inner or row code of the BCH codeword to determine if it was received without errors. If a result of the syndrome computation is zero, then the row BCH codeword can be considered to be error free and the BCH codeword can be communicated directly to outer decoding module 200. If the result of the syndrome computation is non-zero then the BCH codeword is communicated to an error-locator polynomial computation module 104.

Error-locator polynomial computation module 104 employs one of a Berlekamp-Massey, Euclidian, or Berlekamp-Welch decoding algorithms to compute an error-locator polynomial for the row BCH codeword. A Chien search module 106 calculates roots of the error locator polynomial to locate the errors and marks the error rows as erasures. Chien search module 106 also implements an error value computation module 107 that can compute error values based on the BCH codeword. Error value computation module 107 may employ a Forney algorithm or equivalent to calculate the error values. It should be appreciated that however since error values are only employed with non-binary codes, error value computation module 107 is not employed by inner decoding module 100 when the inner code is binary. Error-locator polynomial computation module 104 and Chien search module 106, and error value computation module 107 comprise an error decoding module 108. Inner decoder module 100 communicates the product code codeword, with erasure markings if any, to column or outer decoder module 200.

Outer decoding module 200 includes an outer syndrome computation module 202 that performs a syndrome computation on the outer code of the product codeword. An error evaluation polynomial module 204 calculates the error evaluation polynomial for the BCH codeword. An error value computation module 206 computes the error value. It should be appreciated that error value computation module 206 may be omitted when the column BCH code is a binary code. With binary code the error is corrected by inverting or flipping the error bits. If the number of erasures s is less than n-k, then outer decoding module 200 randomly select n-k-s positions and marks them to be erasures and corrects the total n-k erasures and obtains a valid BCH codeword. Inner decoding module 100 then computes the syndromes of the inner/row BCH codes. If all the row syndromes are zeros, a valid product codeword has been detected. If the number of erasures is greater than n-k, then outer decoding module 200 is unable to correct the erasures and indicates to error correction module 300 that the iterative decoding process must be employed to attempt and recover a valid product codeword.

Error correction module 300 includes a central processing unit (CPU) 302 and associated memory 304. Memory 304 stores computer readable instructions for CPU 302. CPU 302 executes the instructions, which implement the iterative decoding process. The iterative decoding process employs error decoding module 108, including error value computation module 107, to provide hardware acceleration. Therefore, the error decoding module 108 is shared by inner/row decoding and outer/column decoding in an iterative mode. In a non-iterative mode, if the inner/row code and outer/column code are not performed at the same time, inner BCH syndrome computation module 102 and outer syndrome computation module 102 and 202 can be merged, as can error value computation modules 107 and 206. In this case, the hardware can also be shared between the first and second stage decoding. Three-stage decoder 40 conserves power when compared to the prior art by using error decoding module 108 for row error detection in inner decoding module 100 and for iterative correction in error correction module 300. As described above, the row and column codes must be from the same finite field for error decoding module 108 to be shared in this manner. In some applications, inner decoding module 100 and outer decoding module 200 are implemented with hardware and error correction module 300 is implemented with firmware that is stored in memory 304.

Three-stage decoder 40 may also decode BCH codewords that are encoded with different code rates. When the code rate is high, two-dimensional codes become inefficient since limited redundancy has to be split into two dimensions. In such cases one-dimensional RS codes may be employed, i.e. the outer BCH code is disabled. In those applications the BCH codeword may be decoded with only inner decoding module 100, provided error value computation module 107 is enabled. Outer decoding module 200 and error correction module 300 may be disabled to conserve power as there is no erasure information available to them.

Figure 5A:
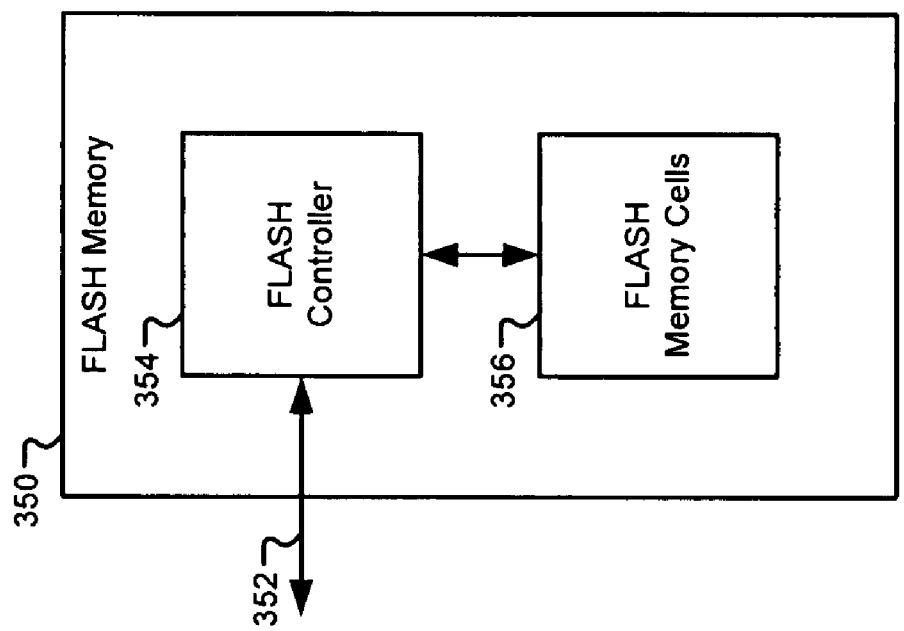
FIG. 5A is a functional block diagram of a flash memory.

Referring now to FIG. 5A, FLASH memory 350 shows one system that three-stage decoder 40 and method 50 may be implemented in. In some embodiments, FLASH memory 350 with the disclosed technology can be included as part of any of the memory components in FIGS. 5B-5C (described below). The present invention may be implemented as part of a FLASH controller 354. FLASH controller 354 can control (e.g., access, modify, etc.) any digital information stored in FLASH memory, and can communicate with other components or devices to provide or store information. FLASH memory serves as the channel. FLASH memory 356 can also include FLASH memory cells 356 for storing the digital information. FLASH memory cells 356 may include any suitable circuitry for storing digital information, such as any transistor-based storage units. In some embodiments, FLASH controller 354 and FLASH memory cells 356 can be implemented in the same package. Alternatively, they may be implemented in separate packages.

Figure 5B:
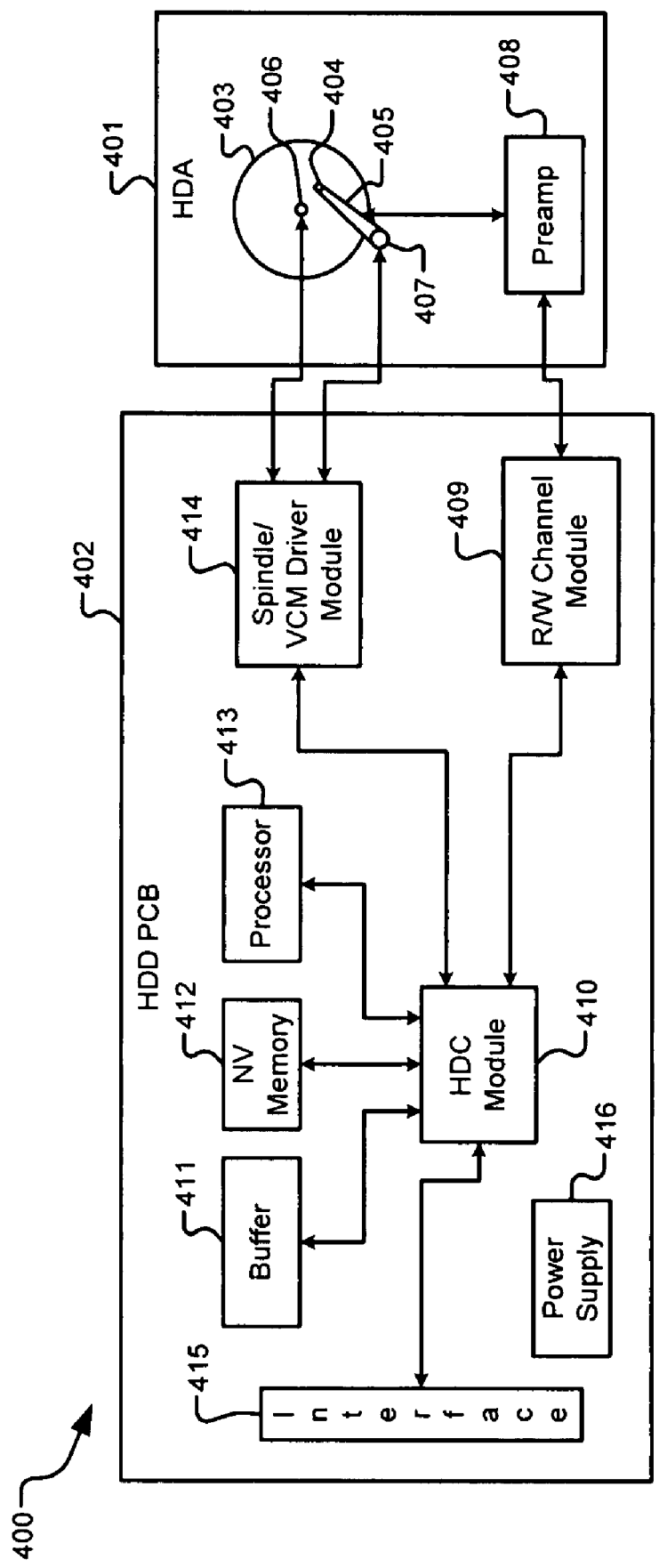
FIG. 5B is a functional block diagram of a hard disk drive.

Referring now to FIG. 5B, FLASH memory 350 can be implemented in a nonvolatile memory 412 of a hard disk drive (HDD) 400. The HDD 400 includes a hard disk assembly (HDA) 401 and a HDD printed circuit board (PCB) 402. The HDA 401 may include a magnetic medium 403, such as one or more platters that store data, and a read/write device 404. The read/write device 404 may be arranged on an actuator arm 405 and may read and write data on the magnetic medium 403. Additionally, the HDA 401 includes a spindle motor 406 that rotates the magnetic medium 403 and a voice-coil motor (VCM) 407 that actuates the actuator arm 405. A preamplifier device 408 amplifies signals generated by the read/write device 404 during read operations and provides signals to the read/write device 404 during write operations.

The HDD PCB 402 includes a read/write channel module 409, a hard disk controller (HDC) module 410, a buffer 411, nonvolatile memory 412, a processor 413, and a spindle/VCM driver module 414. The read/write channel module 409 processes data received from and transmitted to the preamplifier device 408. The HDC module 410 controls components of the HDA 401 and communicates with an external device (not shown) via an I/O interface 415. The external device may include a computer, a multimedia device, a mobile computing device, etc. The I/O interface 415 may include wireline and/or wireless communication links.

The HDC module 410 may receive data from the HDA 401, the read channel 409, the buffer 411, nonvolatile memory 412, the processor 413, the spindle/VCM driver module 414, and/or the I/O interface 415. The processor 413 may process the data, including encoding, decoding, filtering, and/or formatting. The processed data may be output to the HDA 401, the read channel 409, the buffer 411, nonvolatile memory 412, the processor 413, the spindle/VCM driver module 414, and/or the I/O interface 415.

The HDC module 410 may use the buffer 411 and/or nonvolatile memory 412 to store data related to the control and operation of the HDD 400. The buffer 411 may include DRAM, SDRAM, etc. The nonvolatile memory 412 may include FLASH memory 350, phase change memory, magnetic RAM, or multi-state memory, in which each memory cell has more than two states. The spindle/VCM driver module 414 controls the spindle motor 406 and the VCM 407. The HDD PCB 402 includes a power supply 416 that provides power to the components of the HDD 400.

Figure 5C:
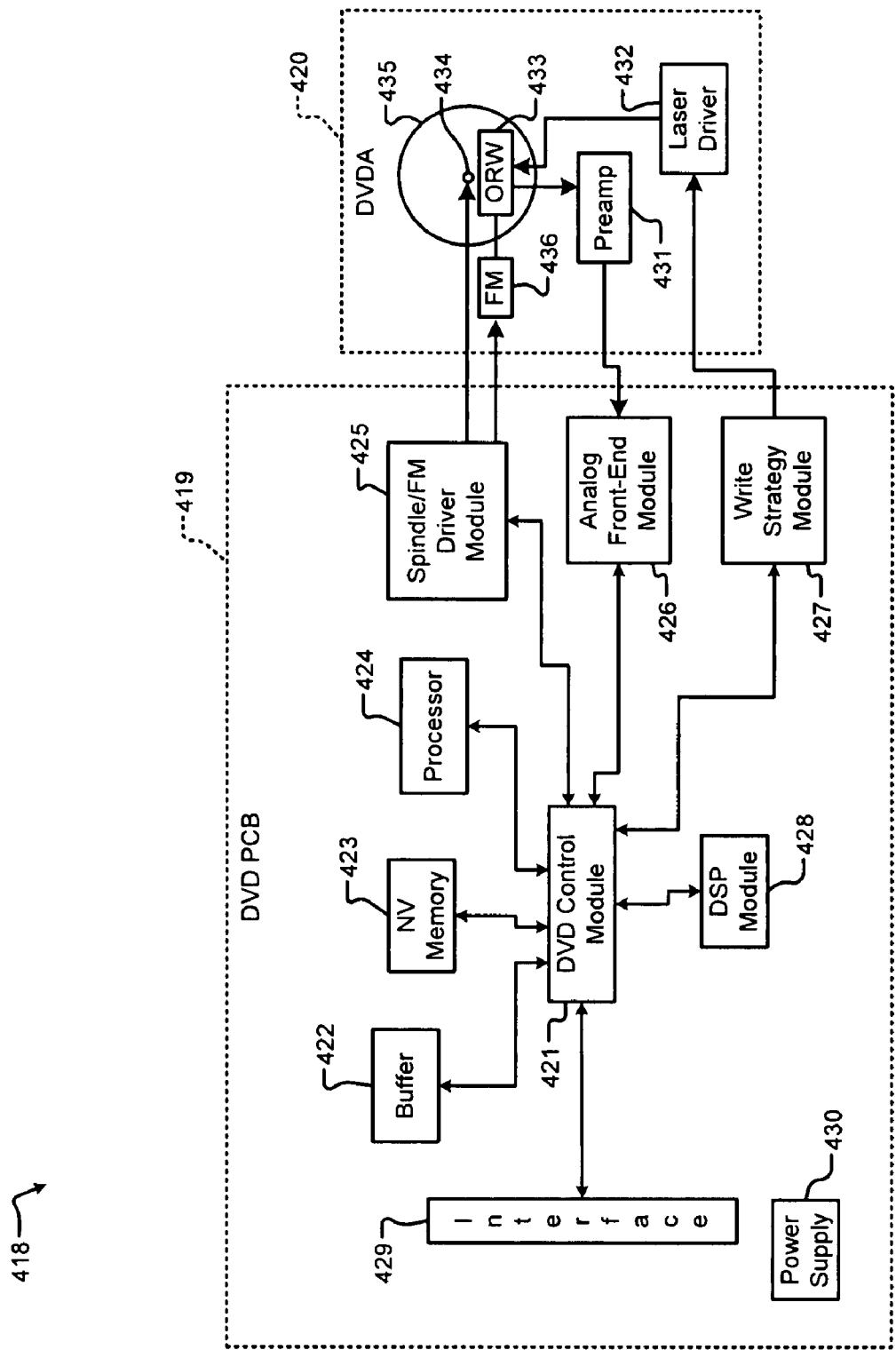
FIG. 5C is a functional block diagram of a DVD drive.

Referring now to FIG. 5C, three-stage decoder 40 can be implemented in a nonvolatile memory 423 of a DVD drive 418 or of a CD drive (not shown). The DVD drive 418 includes a DVD PCB 419 and a DVD assembly (DVDA) 420. The DVD PCB 419 includes a DVD control module 421, a buffer 422, nonvolatile memory 423, a processor 424, a spindle/FM (feed motor) driver module 425, an analog front-end module 426, a write strategy module 427, and a DSP module 428.

The DVD control module 421 controls components of the DVDA 420 and communicates with an external device (not shown) via an I/O interface 429. The external device may include a computer, a multimedia device, a mobile computing device, etc. The I/O interface 429 may include wireline and/or wireless communication links.

The DVD control module 421 may receive and decode at least one of unencoded data and BCH codewords from the buffer 422, nonvolatile memory 423, the processor 424, the spindle/FM driver module 425, the analog front-end module 426, the write strategy module 427, the DSP module 428, and/or the I/O interface 429. The processor 424 may process the data, including encoding, decoding, filtering, and/or formatting. The DSP module 428 performs signal processing, such as video and/or audio coding/decoding. The processed data may be output to the buffer 422, nonvolatile memory 423, the processor 424, the spindle/FM driver module 425, the analog front-end module 426, the write strategy module 427, the DSP module 428, and/or the I/O interface 429.

The DVD control module 421 may use the buffer 422 and/or nonvolatile memory 423 to store data related to the control and operation of the DVD drive 418. The buffer 422 may include DRAM, SDRAM, etc. The nonvolatile memory 423 may include Nonvolatile memory 423 may include FLASH memory 350, phase change memory, magnetic RAM, or multi-state memory, in which each memory cell has more than two states. The DVD PCB 419 includes a power supply 430 that provides power to the components of the DVD drive 418.

The DVDA 420 may include a preamplifier device 431, a laser driver 432, and an optical device 433, which may be an optical read/write (ORW) device or an optical read-only (OR) device. A spindle motor 434 rotates an optical storage medium 435, and a feed motor 436 actuates the optical device 433 relative to the optical storage medium 435.

When reading data from the optical storage medium 435, the laser driver provides a read power to the optical device 433. The optical device 433 detects data from the optical storage medium 435, and transmits the data to the preamplifier device 431. The analog front-end module 426 receives data from the preamplifier device 431 and performs such functions as filtering and ND conversion. To write to the optical storage medium 435, the write strategy module 427 transmits power level and timing data to the laser driver 432. The laser driver 432 controls the optical device 433 to write data to the optical storage medium 435.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A decoder that decodes two-dimensional Bose, Ray-Chaudhuri, Hocquenghem (BCH) codewords, the decoder comprising:
    an inner decoding module that (i) decodes inner codes of the two-dimensional BCH product codewords and (ii) includes an error decoding module that computes inner error locator polynomials for the inner codes of the two-dimensional BCH product codewords;
    an outer decoding module that decodes outer codes of the two-dimensional BCH product codewords; and
    an error correction module that selectively iteratively corrects errors in the two-dimensional BCH product codewords, wherein while iteratively correcting errors, the error correction module employs the error decoding module to calculate outer error locator polynomials for the outer codes of the two-dimensional BCH product codewords.

2. The decoder of claim 1, wherein the error decoding module further comprises a Chien search module that calculates roots of the inner error locator polynomials.

3. The decoder of claim 1, wherein the error decoding module employs at least one of a Berlekamp-Massey algorithm, a Euclidian algorithm, and a Berlekamp-Welch decoding algorithm to compute the inner error locator polynomials.

4. The decoder of claim 1, wherein the inner decoding module marks error rows of the BCH codewords as erasures for processing by the outer decoding module.

5. The decoder of claim 1, wherein the outer decoding module comprises:
    an outer BCH syndrome computation module that performs a syndrome computation on the outer codes; and
    an error evaluation polynomial module that calculates error evaluation polynomials based on the outer BCH codewords.

6. The decoder of claim 5, wherein the outer decoding module further comprises an error value computation module that computes error values based on the outer BCH codewords.

7. The decoder of claim 6, wherein while selectively iteratively correcting errors, the error evaluation polynomial module and the error value computation module are idle.

8. The decoder of claim 1, wherein the error correction module comprises (i) a central processing unit and (ii) a memory that stores computer readable instructions, wherein the computer readable instructions implement the error correction module.

9. The decoder of claim 1, wherein the error decoding module calculates roots of the inner error locator polynomials.

10. The decoder of claim 9, wherein the error decoding module calculates error values corresponding to the roots of the inner error locator polynomials.

11. The decoder of claim 1, wherein while iteratively correcting errors, the error correction module employs the error decoding module to:
    compute the inner error locator polynomials for the inner codes and the outer error locator polynomials for the outer codes;
    calculate roots of the inner error locator polynomials and the outer error locator polynomials; and
    calculate error values corresponding to the roots of the inner error locator polynomials and the roots of the outer error locator polynomials.

12. The decoder of claim 11, wherein the outer decoding module comprises:
    an outer BCH syndrome computation module that performs a syndrome computation on the outer codes;
    an error evaluation polynomial module that calculates error evaluation polynomials based on the outer BCH codewords; and
    an error value computation module that computes error values based on the outer BCH codewords,
    wherein while iteratively correcting errors, the error evaluation polynomial module and the error value computation module are idle.

13. The decoder of claim 1, wherein while iteratively correcting errors, the error correction module employs the error decoding module to decode both (i) the outer codes of the two-dimensional BCH product codewords and (ii) the inner codes of the two-dimensional BCH product codewords.

14. The decoder of claim 1, wherein the error correction module iteratively corrects errors when a number of errors from the inner decoding module exceeds an erasure capacity of the outer decoding module.

15. A method of decoding two-dimensional Bose, Ray-Chaudhuri, Hocquenghem (BCH) codewords, the method comprising:
    providing an error decoding module that calculates inner error locator polynomials;

decoding inner codes of the two-dimensional BCH product codewords using the error decoding module;

providing an outer code decoding module;

decoding outer codes of the two-dimensional BCH product codewords using the outer code decoding module;

selectively performing iterative error correction; and while the iterative error correction is being performed, using the error decoding module to calculate outer error locator polynomials to correct errors in the outer codes of the two-dimensional BCH product codewords.

16. The method of claim 15, wherein the error decoding module calculates roots of the inner error locator polynomials.

17. The method of claim 15, wherein calculating the inner error locator polynomials employs at least one of a Berlekamp-Massey algorithm, a Euclidian algorithm, and a Berlekamp-Welch decoding algorithm.

18. The method of claim 15, wherein decoding inner codes includes marking error rows of the BCH codewords as erasures.

19. The method of claim 18, wherein decoding outer codes further comprises:

performing a syndrome computation on the outer codes; and calculating error evaluation polynomials based on the outer BCH codewords.

20. The method of claim 19, wherein decoding outer codes further comprises computing error values based on the outer BCH codewords.

21. The method of claim 15, further comprising providing (i) a central processing unit and (ii) a memory that stores computer readable instructions, wherein the computer readable instructions implement the selectively performing iterative error correction.

* * * * *